United States Patent
Ito et al.

(10) Patent No.: US 11,054,463 B2
(45) Date of Patent: Jul. 6, 2021

(54) METHOD AND SYSTEM FOR MEASURING THERMAL STABILITY FACTOR OF MAGNETIC TUNNEL JUNCTION DEVICE, SEMICONDUCTOR INTEGRATED CIRCUIT, AND PRODUCTION MANAGEMENT METHOD FOR SEMICONDUCTOR INTEGRATED CIRCUIT

(71) Applicant: TOHOKU UNIVERSITY, Sendai (JP)

(72) Inventors: Kenchi Ito, Sendai (JP); Tetsuo Endoh, Sendai (JP); Hideo Sato, Sendai (JP); Takashi Saito, Sendai (JP); Masakazu Muraguchi, Sendai (JP); Hideo Ohno, Sendai (JP)

(73) Assignee: TOHOKU UNIVERSITY, Sendai (JP)

( * ) Notice: Subject to any disclaimer, the term of this patent is extended or adjusted under 35 U.S.C. 154(b) by 302 days.

(21) Appl. No.: 16/087,781

(22) PCT Filed: Mar. 22, 2017

(86) PCT No.: PCT/JP2017/011408
§ 371 (c)(1),
(2) Date: Sep. 24, 2018

(87) PCT Pub. No.: WO2017/164229
PCT Pub. Date: Sep. 28, 2017

(65) Prior Publication Data
US 2019/0219633 A1 Jul. 18, 2019

(30) Foreign Application Priority Data

Mar. 24, 2016 (JP) .............................. JP2016-059344

(51) Int. Cl.
| | |
|---|---|
| *G01R 31/28* | (2006.01) |
| *H01L 27/22* | (2006.01) |
| *H01L 43/12* | (2006.01) |
| *G01R 27/00* | (2006.01) |
| *H01L 21/66* | (2006.01) |
| *H01L 21/8239* | (2006.01) |

(52) U.S. Cl.
CPC ..... *G01R 31/2874* (2013.01); *G01R 31/2894* (2013.01); *H01L 21/8239* (2013.01);
(Continued)

(58) Field of Classification Search
None
See application file for complete search history.

(56) References Cited

U.S. PATENT DOCUMENTS

| | | | | |
|---|---|---|---|---|
| 2008/0140922 | A1* | 6/2008 | Higo ..................... | B82Y 25/00 |
| | | | | 711/105 |
| 2010/0055502 | A1* | 3/2010 | Kubota ................. | G11C 11/161 |
| | | | | 428/827 |

FOREIGN PATENT DOCUMENTS

| | | |
|---|---|---|
| JP | 2006-202999 A | 8/2006 |
| JP | 2009-026944 A | 2/2009 |

OTHER PUBLICATIONS

Chao et al., "Determination of Thermal Stability of Magnetic Tunnel Junction Using Time-Resolved Single-Shot Measurement" IEEE Transactions on Magnetics, vol. 50, No. 1, Jan. 2014 (Year: 2014).*

(Continued)

*Primary Examiner* — John C Kuan
(74) *Attorney, Agent, or Firm* — Oliff PLC

(57) ABSTRACT

A method and a system for measuring the thermal stability factor of a magnetic tunnel junction device, a semiconductor integrated circuit, and a production management method for the semiconductor integrated circuit, capable of measuring the thermal stability factors of individual devices in a relatively short period of time and quickly performing quality control during material development and at a production site. A meter measures change in resistance value of an evaluation MTJ for a predetermined period while causing a predetermined current to flow into the evaluation MTJ maintained at a predetermined temperature. An analyzer (Continued)

calculates a time constant in which a low-resistance state is maintained and a time constant in which a high-resistance state is maintained from the measured change in resistance value. A thermal stability factor of the evaluation MTJ is calculated on the basis of the calculated time constants and the predetermined current flowing into the evaluation MTJ.

10 Claims, 6 Drawing Sheets

(52) U.S. Cl.
CPC .............. *H01L 22/14* (2013.01); *H01L 22/32* (2013.01); *H01L 27/22* (2013.01); *H01L 27/228* (2013.01); *H01L 43/12* (2013.01); *G01R 27/00* (2013.01); *H01L 22/20* (2013.01)

(56) References Cited

OTHER PUBLICATIONS

Sato et al., "Junction size effect on switching current and thermal stability in CoFeB/MgO perpendicular magnetic tunnel junctions" Appl. Phys. Lett. 99, 042501 (2011) (Year: 2011).*

Sep. 25, 2018 International Preliminary Report on Patentability issued in International Patent Application No. PCT/JP2017/011408.
Brown; "Thermal Fluctuations of a Single-Domain Particle;" Physical Review; vol. 130; No. 5; Jun. 1, 1963.
Chaves-O'Flynn et al; "Thermal Stability of Magnetic States in Circular Thin-Film Nanomagnets with Large Perpendicular Magnetic Anisotropy;" Physical Review Applied; vol. 4; Aug. 18, 2015.
Koch et al; "Time-Resolved Reversal of Spin-Transfer Switching in a Nanomagnet;" Physical Review Letters; vol. 92; No. 8; Feb. 26, 2004.
Thomas et al; "Quantifying data retention of perpendicular spin-transfer-torque magnetic random access memory chips using an effective thermal stability factor method;" Applied Physics Letters; vol. 106; Apr. 20, 2015.
Sato et al; "Perpendicular-anisotropy CoFeB—MgO magnetic tunnel junctions with a MgO/CoFeB/Ta/CoFeB/MgO recording structure;" Applied Physics Letters; vol. 101; Jul. 13, 2012.
Thomas et al; "Solving the Paradox of the Inconsistent Size Dependence of Thermal Stability at Device and Chip-level in Perpendicular STT-MRAM;" TDK-Headway Technologies; 2015.
May 30, 2017 International Search Report issued in International Patent Application No. PCT/JP2017/011408.

* cited by examiner (a)

(b)

(c)

METHOD AND SYSTEM FOR MEASURING THERMAL STABILITY FACTOR OF MAGNETIC TUNNEL JUNCTION DEVICE, SEMICONDUCTOR INTEGRATED CIRCUIT, AND PRODUCTION MANAGEMENT METHOD FOR SEMICONDUCTOR INTEGRATED CIRCUIT

FIELD OF THE INVENTION

The present invention relates to a method and a system for measuring a thermal stability factor of a magnetic tunnel junction device, a semiconductor integrated circuit, and a production management method for the semiconductor integrated circuit.

DESCRIPTION OF RELATED ART

A thermal stability factor is known as a factor indicating the thermal stability of bit information recorded in a non-volatile memory such as MRAM having magneto-resistive devices. This thermal stability factor $\Delta_0$ is expressed by the following equation.

$$\Delta_0 = E_b / k_B T \quad (1)$$

Here, $E_b$ is an energy barrier necessary for magnetization reversal, $k_B$ is the Boltzmann constant, and T is the absolute temperature. Here, the energy barrier is expressed by the following equation.

$$E_b = K_{eff} V \quad (2)$$

Here, $K_{eff}$ is a magnetic anisotropy energy density of a recording layer and V is the volume of a recording layer.

The energy of a recording layer of a magneto-resistive device is expressed by $K_{eff} V \cdot \sin^2 \theta$ (here, $\theta$ is an angle between a magnetization direction of a recording layer and a magnetization direction of a reference layer). When $\sin^2 \theta = 1$ ($\theta = 90°, 270°, \ldots$), an energy barrier ($E_b$) necessary for magnetization reversal is obtained.

A probability P that a magnetization of a recording layer having a thermal stability factor $\Delta_0$ is reversed after a certain time t is expressed by the following equation by the Neel-Arrehenius Law (for example, see Non-Patent Literature 1).

$$P = 1 - \exp\{(-t/10^{-9}) \times \exp(-\Delta_0)\} \quad (3)$$

The time t when P is 50% is a retention period of the recording layer.

A magnetic field pulse method and a current pulse method are known as conventional general methods for measuring the thermal stability factor $\Delta_0$. According to the magnetic field pulse method, a magnetization reversal probability when a magnetic field pulse of a specific pulse width is applied is measured while changing the magnitude of a magnetic field of the magnetic field pulse, and the thermal stability factor $\Delta_0$ is calculated on the basis of the relation between the magnitude of the magnetic field and the reversal probability (for example, see Non-Patent Literature 2). Moreover, according to the current pulse method, a magnetization reversal probability when a current pulse of a specific pulse width is applied is measured while changing the magnitude of a current of the current pulse, and the thermal stability factor $\Delta_0$ is calculated on the basis of the relation between the magnitude of the current and the reversal probability (for example, see Non-Patent Literature 3).

However, a magnetization reversal mode changes to a domain wall mode when the diameter d of a recording layer is larger than a critical diameter dc and changes to a coherent reversal mode when the diameter d is smaller than the critical diameter dc. In the conventional magnetic field pulse method, there is a problem that, since analysis is performed using the equation of the coherent reversal mode as the equation of the energy barrier $E_b$, the value of the energy barrier $E_b$ in the domain wall mode is smaller than an actual value, and an accurate thermal stability factor $\Delta_0$ is not obtained (for example, see Non-Patent Literature 4). It is considered that this problem occurs since the value of the energy barrier $E_b$ decreases due to the influence of an applied magnetic field when the magnetic field pulse method is performed. A similar problem may occur in the current pulse method. In recent years, in order to correct this, a method of performing analysis using the equation of $E_b$ that is valid for the domain wall mode has been proposed (for example, see Non-Patent Literature 5). Although it is considered that a correct value of $E_b$ is obtained in the magnetic field pulse method if this equation is used, there is a problem that it is necessary to perform fitting using different equations for the coherent reversal mode and the domain wall mode. Moreover, in the magnetic field pulse method, there is a problem that, since the response of an electromagnet for generating a magnetic field is slow, measurement takes a considerable amount of time, and several tens of minutes to several hours are taken for measuring the thermal stability factor $\Delta_0$ of one device.

Therefore, as a method for measuring the thermal stability factor $\Delta_0$ different from the magnetic field pulse method and the current pulse method, a method in which an MRAM chip made up of MTJs of 10 Mb or higher is prepared, information of 1/0 is written in the recording layer of each MTJ using a checker board pattern or the like, the MRAM chip rests at a high temperature for several minutes to approximately 100 hours, an error rate indicating how much of the initial information has disappeared is measured, and the thermal stability factor $\Delta_0$ is calculated on the basis of a relation between the resting time and a reversal probability calculated from the error rate (for example, see Non-Patent Literature 6). According to this method, since the value of the energy barrier $E_b$ does not change during measurement, it is possible to calculate an accurate thermal stability factor $\Delta_0$ regardless of the magnetization reversal mode.

CITATION LIST

Non-Patent Literature

Non-Patent Literature 1: W. F. Brown, Jr., "Thermal Fluctuations of a Single-Domain Particle", Phys. Rev., 1963, Vol. 130, Num. 5, p. 1677-1686

Non-Patent Literature 2: H. Sato, M. Yamanouchi, S. Ikeda, S. Fukami, F. Matsukura, and H. Ohno, "Perpendicular-anisotropy CoFeB—MgO magnetic tunnel junctions with a MgO/CoFeB/Ta/CoFeB/MgO recording structure", Appl. Phys. Lett., 2012, 101, 022414

Non-Patent Literature 3: R. H. Koch, J. A. Katine, and J. Z. Sun, "Time-Resolved Reversal of Spin-Transfer Switching in a Nanomagnet", Phys. Rev. Lett., 2004, Vol. 92, Num. 8, 088302

Non-Patent Literature 4: Gabriel D. Chaves-O'Flynn, Georg Wolf, Jonathan Z. Sun, and Andrew D. Kent, "Thermal Stability of Magnetic States in Circular Thin-Film Nanomagnets with Large Perpendicular Magnetic Anisotropy", Phys. Rev. Appl., 2015, 4, 024010

Non-Patent Literature 5: Luc Thomas, Guenole Jan, Son Le, Yuan-Jen Lee, Huanlong Liu, Jian Zhu, Santiago Serrano- Guisan, Ru-Ying Tong, Keyu Pi, Dongna Shen, Renren He, Jesmin Haq, Zhongjian Teng, Rao Annapragada, Vinh Lam, Yu-Jen Wang, Tom Zhong, Terry Torng and Po-Kang Wang, "Solving the Paradox of the Inconsistent Size Dependence of Thermal Stability at Device and Chip-level in Perpendicular STT-MRAM", Proc IEDM2015, 672

Non-Patent Literature 6: Luc Thomas, Guenole Jan, Son Le, and Po-Kang Wang, "Quantifying data retention of perpendicular spin-transfer-torque magnetic random access memory chips using an effective thermal stability factor method", Appl. Phys. Lett., 2015, 106, 162402

SUMMARY OF THE INVENTION

The thermal stability factor measurement method disclosed in Non-Patent Literature 6 measures a thermal stability factor of a chip but does not measure the thermal stability factor of individual devices such as MTJs. Moreover, although an MRAM chip having a capacity of several Mb or higher is necessary in order to perform measurement, since approximately three months are taken for fabrication of the chip, it takes a considerable amount of time until data is obtained, and the wasteful time increases when the chip is used for quality control (QC checking) during material development and at a production site. Moreover, the measurement time increases as the thermal stability factor increases.

The present invention has been made in view of such a problem, and an object thereof is to provide a method and a system for measuring the thermal stability factor of a magnetic tunnel junction device, a semiconductor integrated circuit, and a production management method for the semiconductor integrated circuit, capable of measuring the thermal stability factors of individual devices in a relatively short period of time and quickly performing quality control during material development and at a production site.

In order to attain the object, a method for measuring a thermal stability factor of a magnetic tunnel junction device according to the present invention includes: a measurement step of measuring change in resistance value of the magnetic tunnel junction device for a predetermined period while causing a predetermined current to flow into the magnetic tunnel junction device maintained at a predetermined temperature; a first calculation step of calculating a time constant in which a low-resistance state is maintained and a time constant in which a high-resistance state is maintained from the change in resistance value measured in the measurement step; and a second calculation step of calculating a thermal stability factor of the magnetic tunnel junction device on the basis of the predetermined current and the time constants calculated in the first calculation step.

A system for measuring a thermal stability factor of a magnetic tunnel junction device according to the present invention includes: a temperature controller that maintains the magnetic tunnel junction device at a predetermined temperature; a meter that measures change in resistance value of the magnetic tunnel junction device for a predetermined period while causing a predetermined current to flow into the magnetic tunnel junction device; and an analyzer that calculates a time constant in which a low-resistance state is maintained and a time constant in which a high-resistance state is maintained from the change in resistance value measured by the meter and calculates a thermal stability factor of the magnetic tunnel junction device on the basis of the time constants and the predetermined current.

According to the method and the system for measuring the thermal stability factor of the magnetic tunnel junction device according to the present invention, it is not necessary to generate a magnetic field during measurement and measurement can be performed on respective devices rather than the entire chip having a number of devices. Therefore, it is possible to measure the thermal stability factor in a relatively short period of time. Moreover, since the value of the energy barrier $E_b$ does not change during measurement like the magnetic field pulse method and the current pulse method, it is possible to calculate an accurate thermal stability factor. The method and the system for measuring the thermal stability factor of the magnetic tunnel junction device according to the present invention may perform measurement on a single device only and may perform measurement on a single device a plurality of times, and may perform measurement on a plurality of devices collectively.

According to the method and the system for measuring the thermal stability factor of the magnetic tunnel junction device according to the present invention, since the thermal stability factor can be measured for respective magnetic tunnel junction devices, it is not necessary to feed the management information based on the measurement result back to the initial stage of the chip manufacturing process, but the management information may be fed back to the stage of manufacturing the magnetic tunnel junction device. Due to this, it is possible to save a period from the start of a chip manufacturing process to the preceding stage of manufacturing the magnetic tunnel junction device and to quickly perform quality control during material development and at a production site as compared to a case of feeding the management information back to the initial stage of the chip manufacturing process. In the method and the system for measuring the magnetic tunnel junction device according to the present invention, it is preferable that the change in resistance value of the magnetic tunnel junction device is measured using a prober.

In the method for measuring the thermal stability factor of the magnetic tunnel junction device according to the present invention, it is preferable that the measurement step involves measuring the change in resistance value for each of a plurality of currents of different magnitudes while supplying the plurality of currents sequentially as the predetermined current, the first calculation step involves calculating a time constant $\tau_P$ in which the low-resistance state is maintained and a time constant $\tau_{AP}$ in which the high-resistance state is maintained for each of the currents, and the second calculation step involves calculating the thermal stability factor on the basis of the magnitude of each of the currents and the time constants $\tau_P$ and $\tau_{AP}$ corresponding to each of the currents. In the system for measuring the thermal stability factor of the magnetic tunnel junction device according to the present invention, it is preferable that the meter is configured to measure the change in resistance value for each of a plurality of currents of different magnitudes while supplying the plurality of currents sequentially as the predetermined current, and the analyzer is configured to calculate a time constant $\tau_P$ in which the low-resistance state is maintained and a time constant $\tau_{AP}$ in which the high-resistance state is maintained for each of the currents and calculate the thermal stability factor on the basis of the magnitude of each of the currents and the time constants $\tau_P$ and $\tau_{AP}$ corresponding to each of the currents. In this case, it is possible to calculate the thermal stability factor more accurately.

In the method for measuring the thermal stability factor of the magnetic tunnel junction device according to the present invention, it is preferable that the first calculation step involves calculating a frequency distribution $N_P(t)$ of a period in which the low-resistance state is maintained and a frequency distribution $N_{AP}(t)$ of a period in which the high-resistance state is maintained from the change in resistance value measured in the measurement step and calculating the time constant $\tau_P$ in which the low-resistance state is maintained and the time constant $\tau_{AP}$ in which the high-resistance state is maintained using relations of $N_P(t) \propto \exp(-t/\tau_P)$ and $N_{AP}(t) \propto \exp(-t/\tau_{AP})$. In the system for measuring the thermal stability factor of the magnetic tunnel junction device according to the present invention, it is preferable that the analyzer is configured to calculate the frequency distribution $N_P(t)$ of the period in which the low-resistance state is maintained and the frequency distribution $N_{AP}(t)$ of the period in which the high-resistance state is maintained from the change in resistance value measured in the measurement step and calculate the time constant $\tau_P$ in which the low-resistance state is maintained and the time constant $\tau_{AP}$ in which the high-resistance state is maintained using relations of $N_P(t) \propto \exp(-t/\tau_P)$ and $N_{AP}(t) \propto \exp(-t/\tau_{AP})$. In this case, it is possible to calculate the thermal stability factor more accurately.

In the method for measuring the thermal stability factor of the magnetic tunnel junction device according to the present invention, it is preferable that the second calculation step involves calculating a thermal stability factor $\Delta_0$ and a threshold current value $I_{c0}$, on the basis of the predetermined current I and the time constant $\tau_P$ in which the low-resistance state is maintained and the time constant $\tau_{AP}$ in which the high-resistance state is maintained calculated in the first calculation step, using the following equation.

$$\tau_P/(\tau_P+\tau_{AP})=1/[1+\exp\{-\Delta_0 \cdot (2 \times I/I_{c0})\}] \quad (4)$$

In the system for measuring the thermal stability factor of the magnetic tunnel junction device according to the present invention, it is preferable that the analyzer is configured to calculate the thermal stability factor $\Delta_0$ and the threshold current value $I_{c0}$, on the basis of the predetermined current I and the time constant $\tau_P$ in which the low-resistance state is maintained and the time constant $\tau_{AP}$ in which the high-resistance state is maintained calculated in the first calculation step, using Equation (4). In this case, it is possible to calculate the thermal stability factor more accurately.

In the method for measuring the thermal stability factor of the magnetic tunnel junction device according to the present invention, it is preferable that the measurement step involves measuring the change in resistance value while causing the predetermined current to flow into the magnetic tunnel junction device from a testing terminal which is electrically connected to the magnetic tunnel junction device only so that current flows into the magnetic tunnel junction device only. In the system for measuring the thermal stability factor of the magnetic tunnel junction device according to the present invention, it is preferable that the system includes a testing terminal which is electrically connected to the magnetic tunnel junction device only so that current flows into the magnetic tunnel junction device only, and the meter is configured to measure the change in resistance value while causing the predetermined current to flow into the magnetic tunnel junction device from the testing terminal. In this case, it is possible to calculate an accurate thermal stability factor of a single magnetic tunnel junction device using the testing terminal.

A semiconductor integrated circuit according to the present invention is a semiconductor integrated circuit including a plurality of magnetic tunnel junction devices, the semiconductor integrated circuit including: a testing terminal which is electrically connected to a single magnetic tunnel junction device so that current flows into the magnetic tunnel junction device only.

Since the semiconductor integrated circuit according to the present invention can supply a current to a single magnetic tunnel junction device only using the testing terminal, it is possible to perform measurement and examination using current with respect to the single magnetic tunnel junction device. For example, it is possible to calculate an accurate thermal stability factor of the single magnetic tunnel junction device using the method and the system for measuring the thermal stability factor of the magnetic tunnel junction device according to the present invention. The testing terminal may include a pair of terminals, and the terminals may be electrically connected to a single magnetic tunnel junction device only. The testing terminal is preferably formed of an upper wiring or a lower wiring of the magnetic tunnel junction device and a connection region (VIA).

In the semiconductor integrated circuit according to the present invention, it is preferable that the testing terminal is provided in one magnetic tunnel junction device or in each of a plurality of magnetic tunnel junction devices. In this case, it is possible to perform measurement and examination with respect to one or a plurality of magnetic tunnel junction devices in which the testing terminal is provided and to calculate the thermal stability factor and the like.

In the semiconductor integrated circuit according to the present invention, it is preferable that the testing terminal is used for supplying the predetermined current and measuring the change in resistance value in the measurement step of the method for measuring the thermal stability factor of the magnetic tunnel junction device according to the present invention. In this case, it is possible to calculate an accurate thermal stability factor of the magnetic tunnel junction device in which the testing terminal is provided.

A production management method for the semiconductor integrated circuit according to the present invention is a production management method for a semiconductor integrated circuit including a plurality of magnetic tunnel junction devices, wherein, after the plurality of magnetic tunnel junction devices are manufactured, a thermal stability factor of one or a plurality of the plurality of magnetic tunnel junction devices is calculated according to the method for measuring the thermal stability factor of the magnetic tunnel junction device according to the present invention, and a process of manufacturing the plurality of magnetic tunnel junction devices are managed on the basis of the calculated thermal stability factor.

According to the production management method for the semiconductor integrated circuit according to the present invention, since the thermal stability factor can be measured for respective magnetic tunnel junction devices by the method for measuring the thermal stability factor of the magnetic tunnel junction device according to the present invention, it is not necessary to feed the management information based on the measurement result back to the initial stage of the chip manufacturing process, but the management information may be fed back to the stage of manufacturing the magnetic tunnel junction device. Due to this, it is possible to save a period from the start of a chip manufacturing process to the preceding stage of manufacturing the magnetic tunnel junction device and to quickly perform production management as compared to a case of feeding the management information back to the initial stage of the chip manufacturing process. In the production management method for the semiconductor integrated circuit according to the present invention, it is preferable that the semiconductor integrated circuit is the semiconductor integrated circuit according to the present invention.

According to the present invention, it is possible to provide a method and a system for measuring the thermal stability factor of a magnetic tunnel junction device, a semiconductor integrated circuit, and a production management method for the semiconductor integrated circuit, capable of measuring the thermal stability factors of individual devices in a relatively short period of time and quickly performing quality control during material development and at a production site.

DETAILED DESCRIPTION OF THE INVENTION

Hereinafter, an embodiment of the present invention will be described with reference to the drawings.

FIGS. 1 to 6 illustrate a method and a system for measuring a thermal stability factor of a magnetic tunnel junction device, a semiconductor integrated circuit, and a production management method for the semiconductor integrated circuit according to an embodiment of the present invention.

Semiconductor Integrated Circuit Manufacturing Process

Figure 1:
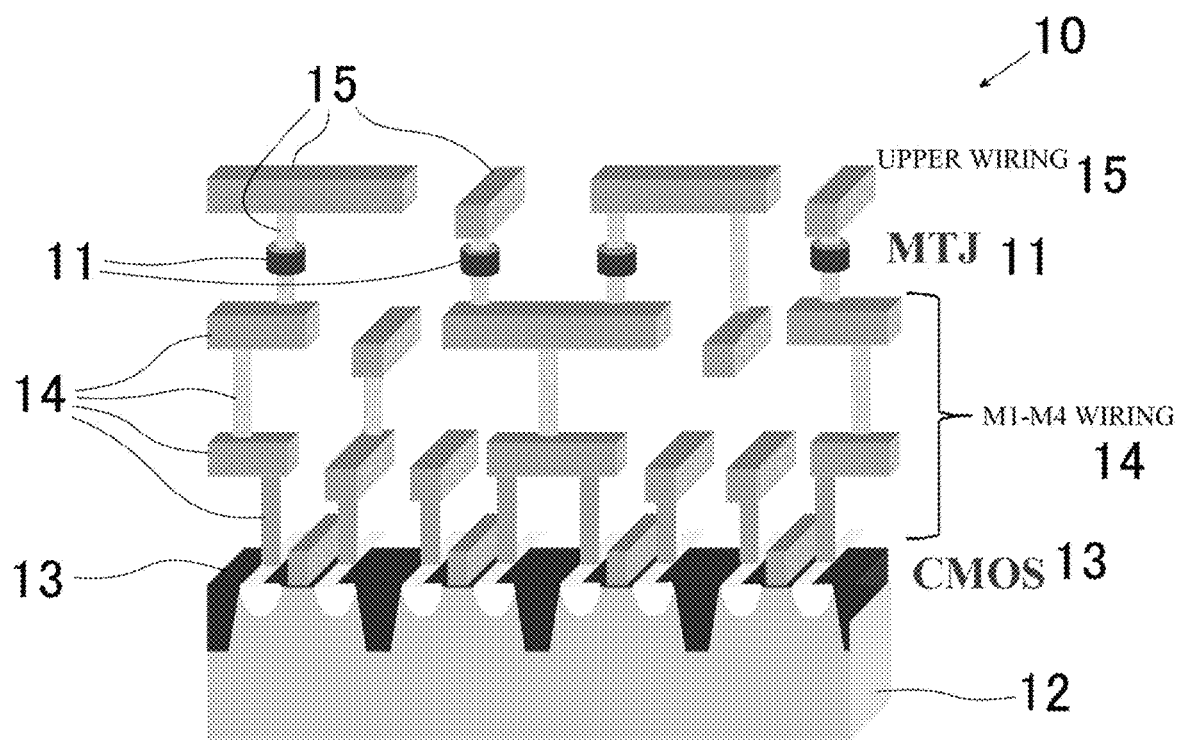
FIG. 1 is a perspective view illustrating a semiconductor integrated circuit according to an embodiment of the present invention.
Figure 2:
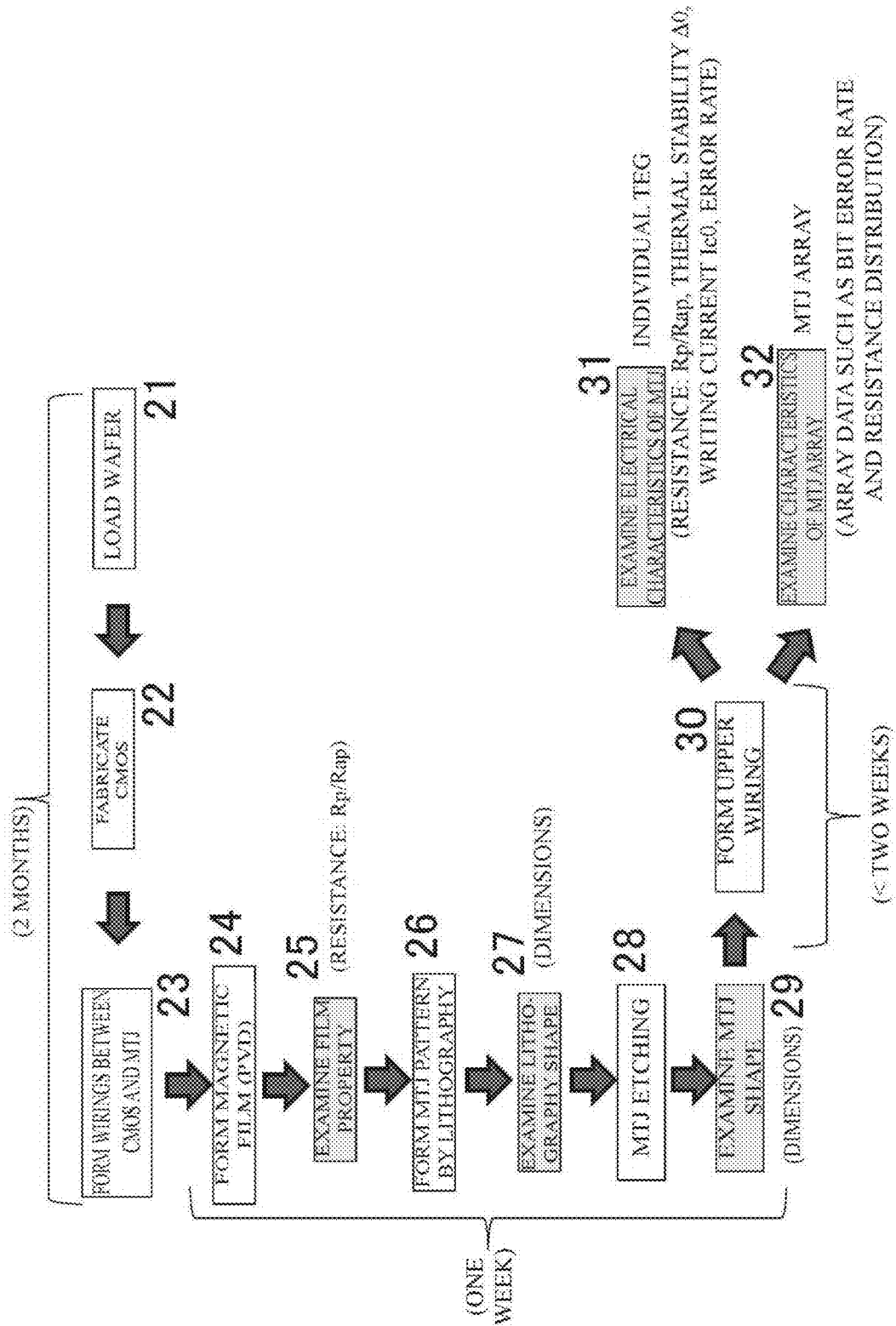
FIG. 2 is a flowchart illustrating a process of manufacturing the semiconductor integrated circuit according to the embodiment of the present invention.

As illustrated in FIG. 1, a semiconductor integrated circuit 10 of an embodiment of the present invention is formed of an MRAM (magnetoresistance memory) having a number of MTJs (magnetic tunnel junction devices) 11 and is manufactured according to a manufacturing process illustrated in FIG. 2.

As illustrated in FIGS. 1 and 2, first, a wafer 12 serving as a substrate is loaded (step 21), a CMOS 13 is fabricated on a surface thereof (step 22), and a multi-layered intermediate wiring 14 (for example, M1-M4 wiring) for connection to the MTJs 11 is formed on the fabricated CMOS 13 (step 23). Generally, the manufacturing process up to this step 23 takes approximately two months. Subsequently, a magnetic film is formed by PVD (physical vapor deposition) on an upper part of the intermediate wiring 14 (step 24), and a film property of the magnetic film is examined (step 25). After that, an MTJ pattern is formed by lithography (step 26) and the shape of the lithography is examined (step 27). After that, the MTJs 11 are formed by etching (step 28), and the shape of the MTJs 11 is examined (step 29). Generally, the MTJ manufacturing process of steps 24 to 29 takes approximately one week.

After the shape of the MTJs 11 is examined, an upper wiring 15 is formed on the MTJs 11 (step 30). Generally, this step 30 ends in two weeks. After the upper wiring 15 is formed, electrical characteristics of single MTJs 11 are examined (step 31), and the characteristics of an MTJ array are examined (step 32). Examples of the examined electrical characteristics of the MTJs 11 include a resistance value, thermal stability, a writing current, an error rate, and the like. Examples of the examined characteristics of the MTJ array include a bit error rate, a resistance distribution, and the like.

Figure 3:
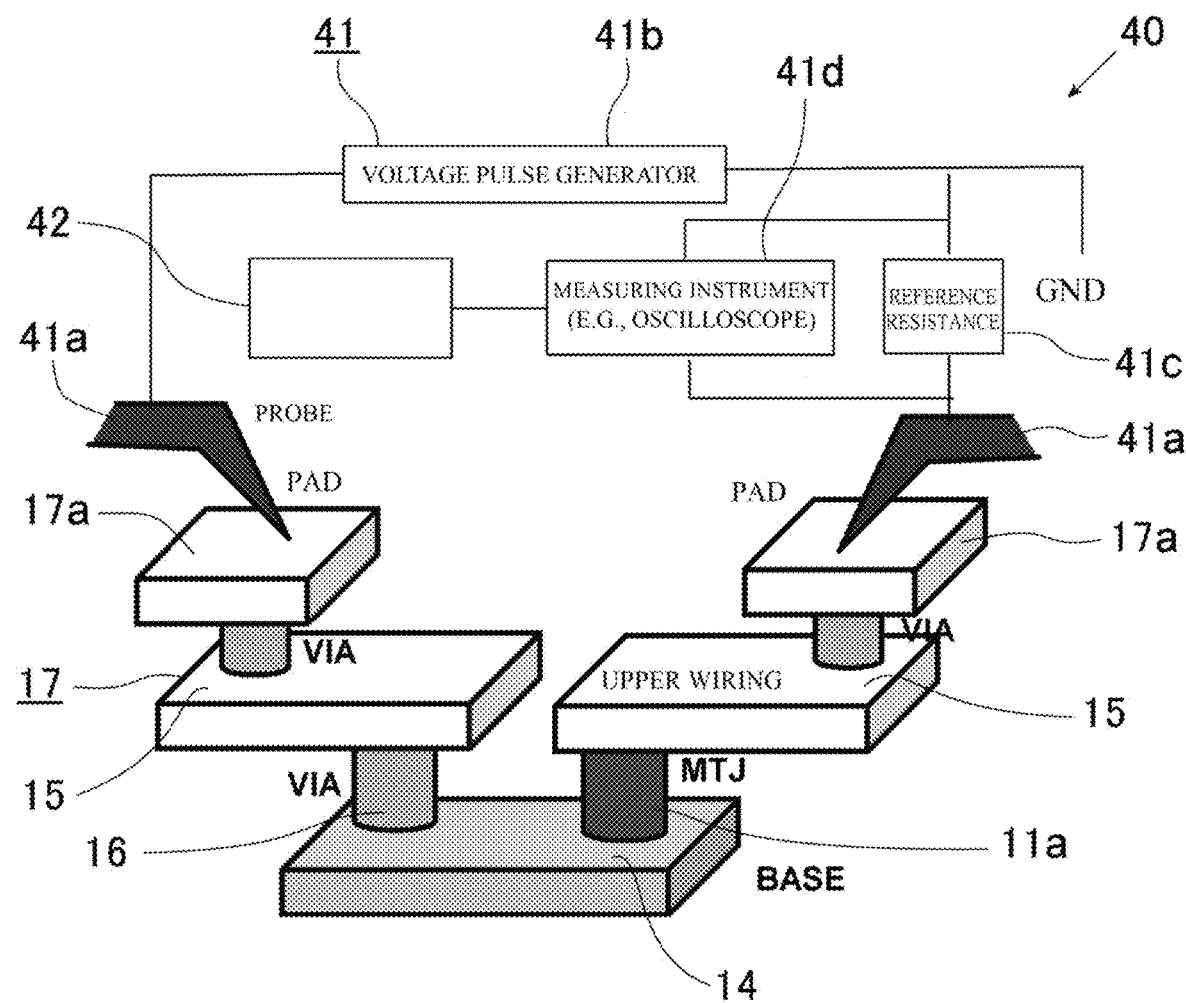
FIG. 3 is a perspective view illustrating an evaluation MTJ of the semiconductor integrated circuit according to the embodiment of the present invention and is a block diagram illustrating a system for measuring a thermal stability factor of the magnetic tunnel junction device according to the embodiment of the present invention.

In step 30, as illustrated in FIG. 3, a testing terminal block 17, which includes the intermediate wiring 14, a connection region (VIA) 16, and the upper wiring 15, is formed so as to be electrically connected to an evaluation MTJ 11$a$ only without being electrically connected to the CMOS 13 illustrated in FIG. 1 or the intermediate wiring 14 connected to the CMOS 13. In the example illustrated in FIG. 3, the testing terminal block 17 is made up of a pair of terminals. One terminal is formed of the upper wiring 15 formed in an upper part of a single evaluation MTJ 11$a$, and the other terminal includes an intermediate wiring (BASE) 14 connected to a lower part of the evaluation MTJ 11$a$, the connection region 16 formed on the intermediate wiring 14, and the upper wiring 15. The testing terminal block 17 is configured to supply current to only the single evaluation MTJ 11$a$ electrically connected thereto and can be used when examining the electrical characteristics in step 31.

Figure 4B:
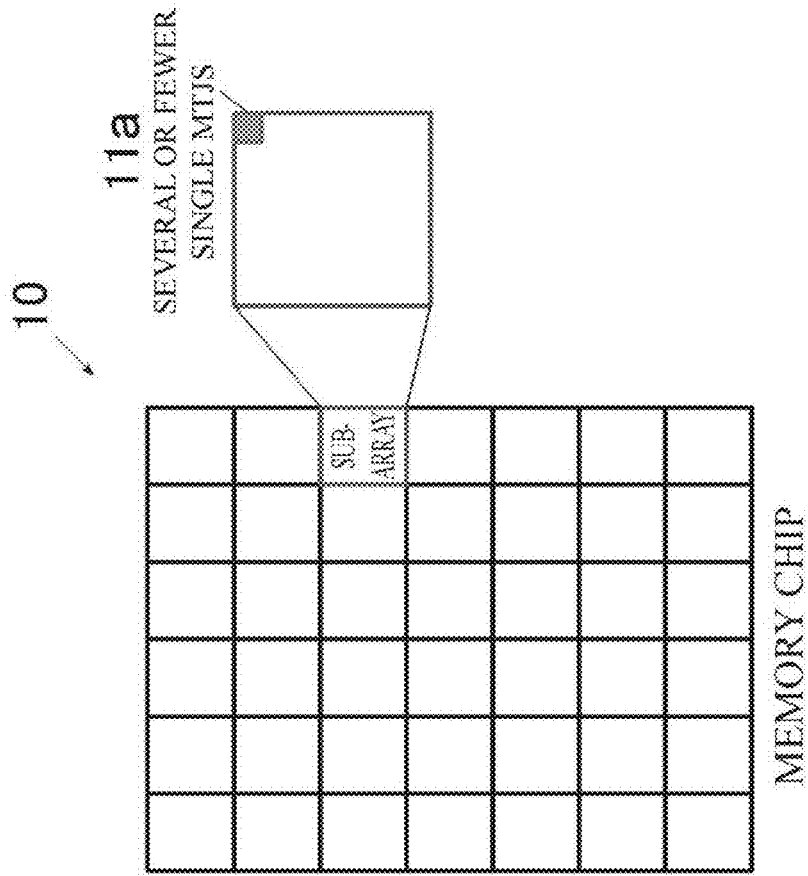
FIG. 4($a$) is a plan view in which evaluation MTJs are arranged at corners of a memory chip of the semiconductor integrated circuit according to the embodiment of the present invention, and FIG. 4($b$) is a plan view in which evaluation MTJs are arranged in respective sub-arrays in the memory chip.
Figure 4A:
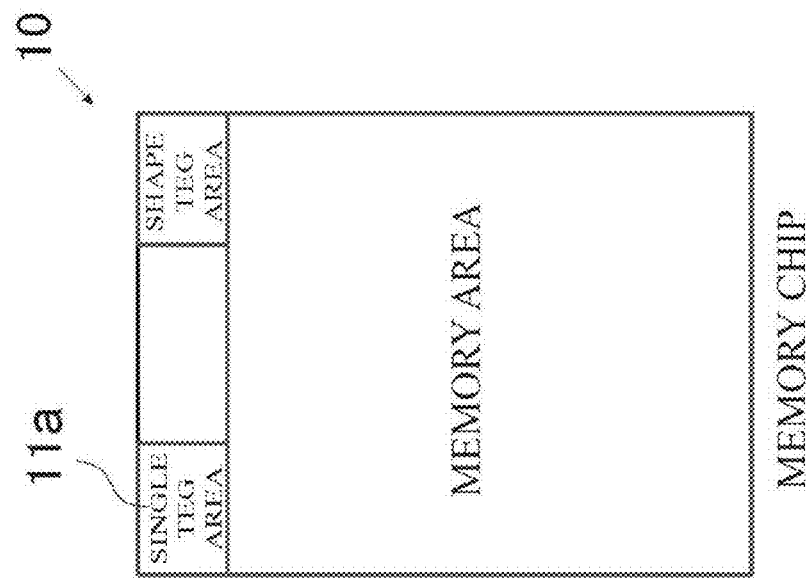

One to several testing terminal blocks 17 may be disposed at a corner of a memory chip as a single TEG (test element group) as illustrated in FIG. 4($a$), and one to several testing terminal blocks 17 may be arranged in respective sub-arrays in the memory chip as illustrated in FIG. 4($b$). The disposed one to several testing terminal blocks 17 have a pad 17$a$ connected to the upper wiring 15, which is completely independent from a pad group for realizing external electrical connection to bit lines and word lines of a memory array to be described later. A probe such as a prober for realizing electrical connection to various electrical measurement apparatuses, for example, comes into contact with this pad 17$a$ to electrically measure the characteristics of the evaluation MTJ 11$a$. On the other hand, the pad group for realizing external electrical connection to bit lines and word lines of a memory array is connected to pins of a package via wires, for example. Therefore, it is not possible to measure the electrical characteristics of the single evaluation MTJ 11a using these pads.

In this manner, the semiconductor integrated circuit 10 made up of MRAM memory chips can be manufactured according to the manufacturing method illustrated in FIG. 2.

Figure 5:
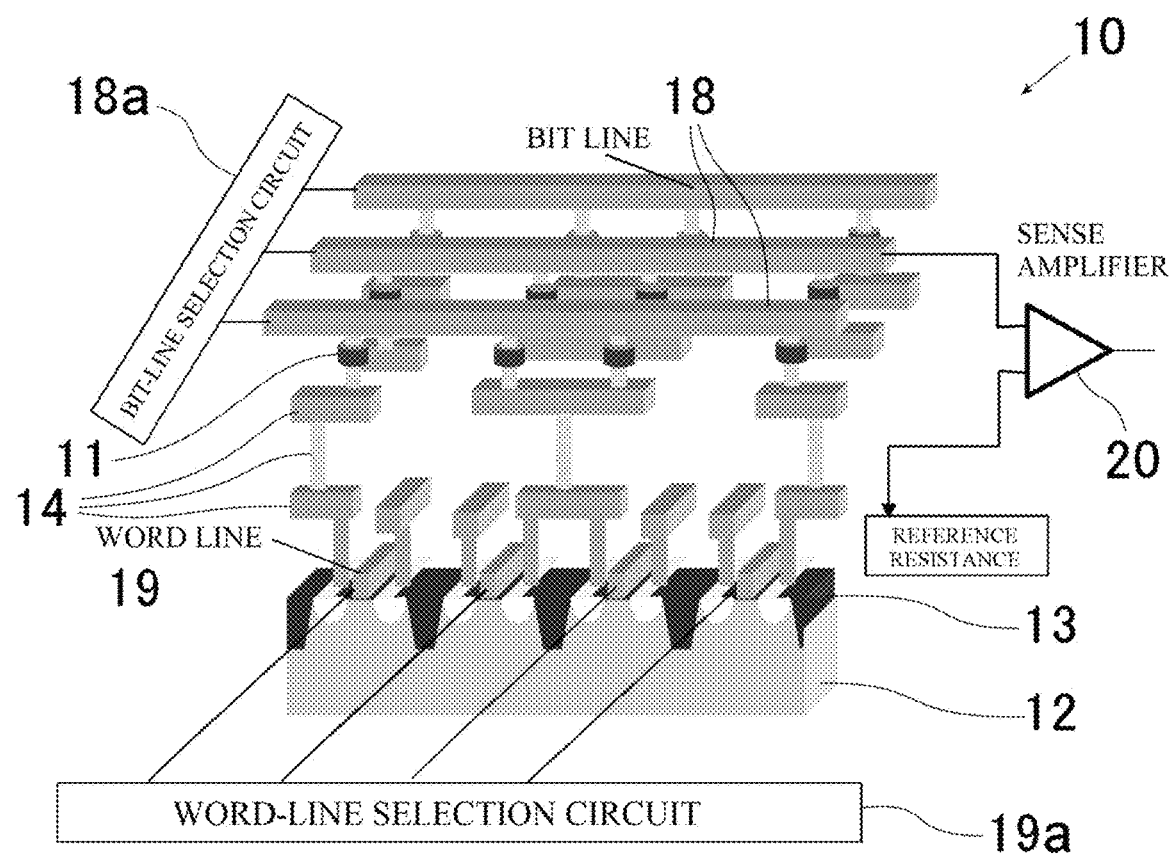
FIG. 5 is a perspective view illustrating an MTJ array structure of the semiconductor integrated circuit according to the embodiment of the present invention.
Figure 6:
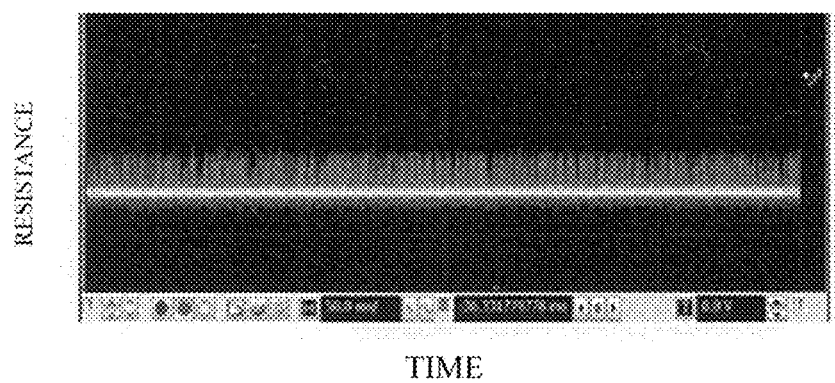
FIG. 6($a$) illustrates an example of an observed waveform of a resistance value of an evaluation MTJ observed by an oscilloscope according to a method for measuring the thermal stability factor of a magnetic tunnel junction device according to an embodiment of the present invention, FIG. 6($b$) is a graph illustrating a frequency distribution of a period in which a low-resistance state is maintained and a period in which a high-resistance state is maintained and an example of a curve obtained by fitting, and FIG. 6($c$) is a graph illustrating a relation between a current flowing into the evaluation MTJ and the time constants for the low-resistance state and the high-resistance state and an example of a curve obtained by fitting.
Figure 6:
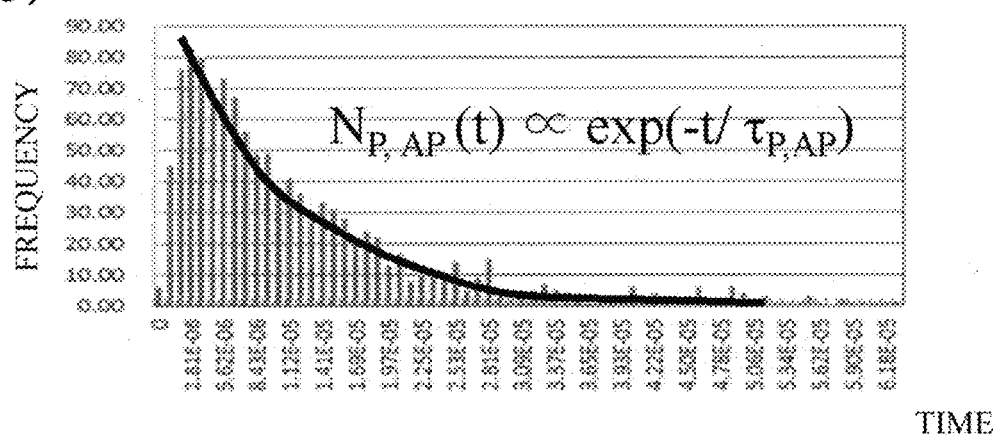
Figure 6:
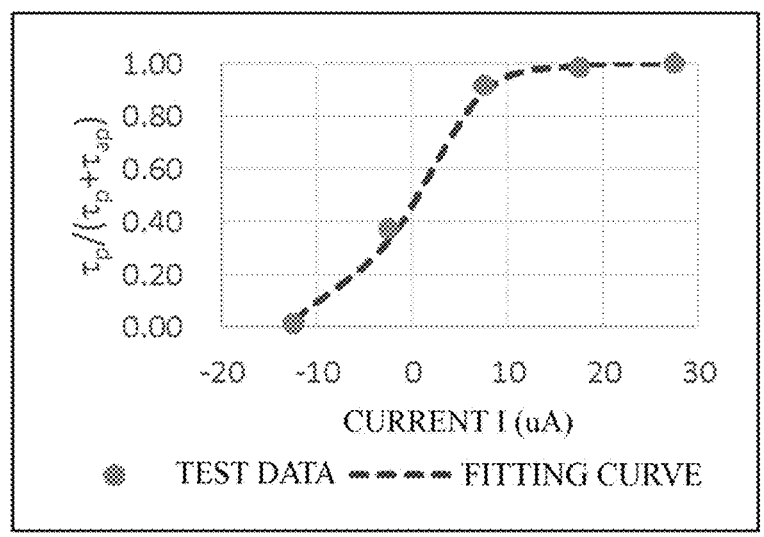

As illustrated in FIG. 5, the manufactured semiconductor integrated circuit 10 excluding the evaluation MTJ 11a is formed of MRAMs in which a plurality of bit lines 18 are wired as the upper wiring 15 of the MTJs 11 and a plurality of word lines 19 are wired in the upper part of the CMOS 13. The bit lines 18 are arranged in parallel to each other and are connected to a bit-line selection circuit 18a. The word lines 19 are arranged in parallel to each other and are connected to a word-line selection circuit 19a.

In this semiconductor integrated circuit 10, when data is written to an arbitrary MTJ 11, the bit-line selection circuit 18a and the word-line selection circuit 19a apply a voltage to a predetermined bit line 18 and a predetermined word line 19, respectively, on the basis of a writing bit number. Moreover, when data is read from an arbitrary MTJ 11, the bit-line selection circuit 18a and the word-line selection circuit 19a select a predetermined bit line 18 and a predetermined word line 19, respectively, on the basis of a reading bit number and connect the selected bit line and word line to a sense amplifier 20. The examination of the characteristics of the MTJ array in step 32 of FIG. 2 can be performed using the circuit illustrated in FIG. 5.

Measurement of Thermal Stability Factor

Next, a method and a system for measuring the thermal stability factor of the magnetic tunnel junction device according to the embodiment of the present invention, for measuring the thermal stability factor among the electrical characteristics of the single evaluation MTJ 11a examined in step 31 of FIG. 2 will be described.

As illustrated in FIG. 3, a system 40 for measuring the thermal stability factor of the magnetic tunnel junction device according to the embodiment of the present invention includes a temperature controller (not illustrated), a meter 41, and an analyzer 42.

The temperature controller is formed of a prober capable of controlling temperature and has a wafer 12 including the evaluation MTJ 11a mounted thereon so that the evaluation MTJ can be maintained at a predetermined temperature. The meter 41 includes a pair of probes 41a of the prober of the temperature controller, a voltage pulse generator 41b, a reference resistance 41c, and a voltage meter 41d, for example. The voltage pulse generator 41b is connected to the respective probes 41a to apply a voltage pulse between the probes 41a. The reference resistance 41c is connected in series between one probe 41a and the voltage pulse generator 41b. The voltage meter 41d is formed of a meter such as an oscilloscope capable of measuring a voltage and is connected in parallel to the reference 41c to measure a voltage generated in the reference resistance 41c. For example, a DC current source and a trigger mechanism for designating a timing for generating a current from the DC current source may be used instead of the voltage pulse generator 41b.

The meter 41 is configured such that the probes 41a are brought into contact with the testing terminal blocks 17 of the evaluation MTJ 11a, a predetermined voltage pulse is generated by the voltage pulse generator 41b and is applied across both ends of the evaluation MTJ 11a to cause a predetermined current to flow into the evaluation MTJ 11a. Moreover, a voltage generated between both ends of the reference resistance 41c generated due to the current is monitored and measured by the voltage meter 41d for a predetermined period to measure change in resistance value of the evaluation MTJ 11a.

The analyzer 42 is formed of a computer and is connected to the voltage meter 41d to receive the measured values. The analyzer 42 calculates a time constant in which a low-resistance state is maintained and a time constant in which a high-resistance state is maintained from the change in resistance value measured by the voltage meter 41d. Moreover, the analyzer 42 calculates a thermal stability factor of the evaluation MTJ 11a on the basis of the calculated time constants and the current flowing into the evaluation MTJ 11a.

The method for measuring the thermal stability factor of the magnetic tunnel junction device according to the embodiment of the present invention can be ideally performed by the system 40 for measuring the thermal stability factor of the magnetic tunnel junction device illustrated in FIG. 3. That is, in the method for measuring the thermal stability factor of the magnetic tunnel junction device according to the embodiment of the present invention, first, in a state in which the evaluation MTJ 11a is maintained at a predetermined temperature by the temperature controller, the meter 41 measures change in resistance value of the evaluation MTJ 11a for a predetermined period while causing a predetermined current to flow into the evaluation MTJ 11a. A specific measurement example in the voltage meter 41a formed of an oscilloscope in this case is illustrated in FIG. 6(a). A measurement temperature was 240° C. The measurement period in FIG. 6(a) was 500 msec. As illustrated in FIG. 6(a), it can be ascertained that the measured change in resistance value includes a low-resistance state and a high-resistance state.

Subsequently, the analyzer 42 calculates a frequency distribution $N_P(t)$ of a period in which a low-resistance state is maintained and a frequency distribution $N_{AP}(t)$ of a period in which a high-resistance state is maintained from the measured change in resistance value and calculates a time constant $\tau_P$ in which a low-resistance state is maintained and a time constant $\tau_{AP}$ in which a high-resistance state is maintained from the decaying states of the frequency distributions using the relations of $N_P(t) \propto \exp(-t/\tau_P)$ and $N_{AP}(t) \propto \exp(-t/\tau_{AP})$, respectively, by fitting such as the least-squares method. The frequency distributions $N_P(t)$ and $N_{AP}(t)$ of the period in which a low-resistance state is maintained and the period in which a high-resistance state is maintained obtained by actual measurement and an example of a curve obtained by fitting are illustrated in FIG. 6(b).

The meter 41 measures change in resistance value for each of a plurality of currents of different magnitudes while supplying the plurality of currents sequentially and the analyzer 42 calculates the time constant $\tau_P$ in which the low-resistance state is maintained and the time constant $\tau_{AP}$ in which the high-resistance state is maintained, corresponding to each of the currents.

After the time constants $\tau_P$ and $\tau_{AP}$ for the plurality of currents of different magnitudes are calculated, a thermal stability factor $\Delta_0$ and a threshold current value $I_{c0}$ are calculated by fitting such as the least-squares method using Equation (4). A relation between each current and the left side $\tau_P/(\tau_P+\tau_{AP})$ of Equation (4) obtained by actual measurement and an example of the curve obtained by fitting are illustrated in FIG. 6(c). In the specific example illustrated in FIG. 6(c), the thermal stability factor $\Delta_0$ was 24.69 and the threshold current value $I_{c0}$ was 175.44 μA when the temperature of the evaluation MTJ 11a was 240° C. The thermal stability factor at a room temperature is estimated to be 24.69×(240+273)/(25+273)=43.5. In this manner, it is possible to calculate the thermal stability factor at all operating temperatures including a room temperature easily from measurements performed at high temperatures.

In the embodiment, an example in which the change in resistance value for each of a plurality of currents of different magnitudes is measured while supplying the plurality of currents sequentially, and the analyzer 42 calculates the time constant $\tau_P$ in which a low-resistance state is maintained and the time constant $\tau_{AP}$ in which a high-resistance state is maintained, corresponding to each of the currents, has been described. However, a DC current sufficient for monitoring a resistance state may be used as the current, the time constant $\tau_P$ in which the low-resistance state is maintained and the time constant $\tau_{AP}$ in which the high-resistance state is maintained may be calculated for each magnetic field while changing a magnetic field pulse (intensity H), and the thermal stability factor $\Delta_0$ and a threshold magnetic field $H_{C0}$ may be calculated using Equation (5) below, for example.

$$\tau_P/(\tau_P+\tau_{AP})=1/[1+\exp\{-\Delta_0\cdot(4\times H/H_{C0})\}] \quad (5)$$

In the measurement method which uses the current or the magnetic field, the temperature may be changed while fixing the current or magnetic field value. In this case, by changing the value of the temperature T in $\Delta_0=E_b/k_BT$ of Equation (4) or (5), $E_b$ can be calculated from the measurement result of different T.

As described above, according to the method and the system 40 for measuring the thermal stability factor of the magnetic tunnel junction device according to the embodiment of the present invention, it is not necessary to generate a magnetic field during measurement and measurement is performed on the single evaluation MTJ 11a only rather than the entire chip having a number of devices. Therefore, it is possible to measure the thermal stability factor $\Delta_0$ of the single evaluation MTJ 11a in a relatively short period of time. Moreover, since the value of the energy barrier $E_b$ does not change during measurement like the magnetic field pulse method and the current pulse method, it is possible to calculate an accurate thermal stability factor $\Delta_0$ of the single evaluation MTJ 11a.

Production Management of Semiconductor Integrated Circuit

Next, a production management method for the semiconductor integrated circuit according to the embodiment of the present invention will be described.

When the thermal stability factor of one or a plurality of evaluation MTJs 11a on the memory chip is calculated by the method and the system 40 for measuring the thermal stability factor of the magnetic tunnel junction device according to the embodiment of the present invention in step 31 of FIG. 2, management of the MTJ manufacturing process of steps 24 to 29 is performed on the basis of the thermal stability factor. For example, when a desired thermal stability factor is not obtained, the thermal stability factor may be fed back to step 24 and the conditions for manufacturing the MTJ 11 may be changed.

According to the production management method for the semiconductor integrated circuit according to the embodiment of the present invention, it is not necessary to feed the management information based on the measurement result of the evaluation MTJ 11a back to the initial stage (step 21) of the chip manufacturing process. Due to this, it is possible to save a period from the start of the chip manufacturing process to the preceding stage (steps 21 to 23) of manufacturing the MTJ 11 as compared to a case of feeding the management information back to the initial stage of the chip manufacturing process. For example, in the manufacturing process illustrated in FIG. 2, it is possible to save two months for steps 21 to 23 and quickly perform quality control and production management during material development and at a production site.

REFERENCE SIGNS LIST

10: Semiconductor integrated circuit
11: MTJ
12: Wafer
13: CMOS
14: Intermediate wiring
15: Upper wiring
16: Connection region
17: Testing terminal block
  17a: Pad
18: Bit line
18a: Bit-line selection circuit
19: Word line
19a: Word-line selection circuit
20: Sense amplifier
40: System for measuring thermal stability factor of magnetic tunnel junction device
41: Meter
  41a: Probe
  41b: Voltage pulse generator
  41c: Reference
  41d: Voltage meter
42: Analyzer

What is claimed is:

1. A method for measuring a thermal stability factor of a magnetic tunnel junction device, comprising:
  a measurement step of measuring change in resistance value of the magnetic tunnel junction device for a predetermined period while causing a predetermined current to flow into the magnetic tunnel junction device maintained at a predetermined temperature;
  a first calculation step of calculating a time constant in which a low-resistance state is maintained and a time constant in which a high-resistance state is maintained from the change in resistance value measured in the measurement step, the first calculation step comprising calculating a frequency distribution $N_P(t1)$ of a period t1 in which the low-resistance state is maintained and a frequency distribution $N_{AP}(t2)$ of a period t2 in which the high-resistance state is maintained from the change in resistance value measured in the measurement step and calculating the time constant $\tau_P$ in which the low-resistance state is maintained and the time constant $\tau_{AP}$ in which the high-resistance state is maintained using relations of $N_P(t1) \propto \exp(-t1/\tau_P)$ and $N_{AP}(t2) \propto \exp(-t2/\tau_{AP})$, respectively; and
  a second calculation step of calculating a thermal stability factor of the magnetic tunnel junction device based on the predetermined current and the time constants calculated in the first calculation step.

2. The method for measuring the thermal stability factor of the magnetic tunnel junction device according to claim 1, wherein
  the measurement step comprises measuring the change in resistance value for each of a plurality of currents of different magnitudes while supplying the plurality of currents sequentially as the predetermined current,
  the first calculation step comprises calculating the time constant $\tau_P$ in which the low-resistance state is maintained and the time constant $\tau_{AP}$ in which the high-resistance state is maintained for each of the currents, the second calculation step comprises calculating the thermal stability factor based on the magnitude of each of the currents and the time constants $\tau_P$ and $\tau_{AP}$ corresponding to each of the currents.

3. The method for measuring the thermal stability factor of the magnetic tunnel junction device according to claim 1, wherein the second calculation step comprises calculating a thermal stability factor $\Delta_0$ and a threshold current value $I_{c0}$, based on the predetermined current I and the time constant $\tau_P$ in which the low-resistance state is maintained and the time constant $\tau_{AP}$ in which the high-resistance state is maintained calculated in the first calculation step, using an equation of $\tau_P/(\tau_P \pm \tau_{AP})=1/[1+\exp\{-\Delta_0 \cdot (2 \times I/I_{c0})\}]$.

4. The method for measuring the thermal stability factor of the magnetic tunnel junction device according to claim 1, wherein the measurement step comprises measuring the change in resistance value while causing the predetermined current to flow into the magnetic tunnel junction device from a testing terminal which is electrically connected to the magnetic tunnel junction device only so that current flows into the magnetic tunnel junction device only.

5. A production management method for a semiconductor integrated circuit including a plurality of magnetic tunnel junction devices, comprising calculating a thermal stability factor of one or a plurality of the plurality of magnetic tunnel junction devices according to the method for measuring the thermal stability factor of the magnetic tunnel junction device according to claim 1; and managing a process of manufacturing the plurality of magnetic tunnel junction devices based on the calculated thermal stability factor.

6. The production management method for the semiconductor integrated circuit according to claim 5, wherein the semiconductor integrated circuit comprises:

a testing terminal which is electrically connected to a single magnetic tunnel junction device so that current flows into the single magnetic tunnel junction device only.

7. A system for measuring a thermal stability factor of a magnetic tunnel junction device, comprising:

a temperature controller that maintains the magnetic tunnel junction device at a predetermined temperature;

a meter that measures change in resistance value of the magnetic tunnel junction device for a predetermined period while causing a predetermined current to flow into the magnetic tunnel junction device; and an analyzer configured to:

calculate a time constant in which a low-resistance state is maintained and a time constant in which a high-resistance state is maintained from the change in resistance value measured by the meter and calculates a thermal stability factor of the magnetic tunnel junction device based on the time constants and the predetermined current; and calculate a frequency distribution $N_P(t1)$ of a period t1 in which a low-resistance state is maintained and a frequency distribution $N_{AP}(t2)$ of a period t2 in which a high-resistance state is maintained from the change in resistance value measured by the meter and calculate the time constant $\tau_P$ in which the low-resistance state is maintained and the time constant $\tau_{AP}$ in which the high-resistance state is maintained using relations of $N_P(t1) \propto \exp(-t1/\tau_P)$ and $N_{AP}(t2) \propto \exp(t2/\tau_{AP})$, respectively.

8. The system for measuring the thermal stability factor of the magnetic tunnel junction device according to claim 7, wherein the meter is configured to measure the change in resistance value for each of a plurality of currents of different magnitudes while supplying the plurality of currents sequentially as the predetermined current, and the analyzer is configured to calculate the time constant $\tau_P$ in which the low-resistance state is maintained and the time constant $\tau_{AP}$ in which the high-resistance state is maintained for each of the currents and calculate the thermal stability factor based on the magnitude of each of the currents and the time constants $\tau_P$ and $\tau_{AP}$ corresponding to each of the currents.

9. The system for measuring the thermal stability factor of the magnetic tunnel junction device according to claim 7, wherein the analyzer is configured to calculate a thermal stability factor $\Delta_0$ and a threshold current value $I_{c0}$, based on the predetermined current I and the time constant $\tau_P$ in which the low-resistance state is maintained and the time constant $\tau_{AP}$ in which the high-resistance state is maintained calculated in the first calculation step, using an equation of $\tau_P/(\tau_P+\tau_{AP})=1/[1+\exp\{-\Delta_0 \cdot (2 \times I/I_{c0})\}]$.

10. The system for measuring the thermal stability factor of the magnetic tunnel junction device according to claim 7, wherein the system comprises a testing terminal which is electrically connected to the magnetic tunnel junction device only so that current flows into the magnetic tunnel junction device only, and the meter is configured to measure the change in resistance value while causing the predetermined current to flow into the magnetic tunnel junction device from the testing terminal.

* * * * *